United States Patent
Wallace, Jr.

(10) Patent No.: US 7,507,291 B2
(45) Date of Patent: *Mar. 24, 2009

(54) METHOD AND APPARATUS FOR GROWING MULTIPLE CRYSTALLINE RIBBONS FROM A SINGLE CRUCIBLE

(75) Inventor: Richard Lee Wallace, Jr., Acton, MA (US)

(73) Assignee: Evergreen Solar, Inc., Marlborough, MA (US)

( * ) Notice: Subject to any disclaimer, the term of this patent is extended or adjusted under 35 U.S.C. 154(b) by 320 days.

This patent is subject to a terminal disclaimer.

(21) Appl. No.: 11/396,800

(22) Filed: Apr. 3, 2006

(65) Prior Publication Data

US 2006/0191470 A1    Aug. 31, 2006

Related U.S. Application Data

(63) Continuation of application No. 10/942,475, filed on Sep. 16, 2004, now Pat. No. 7,022,180, which is a continuation of application No. 10/284,067, filed on Oct. 30, 2002, now Pat. No. 6,814,802.

(51) Int. Cl.
*C30B 15/34*  (2006.01)

(52) U.S. Cl. .............................. 117/13; 117/24; 117/26; 117/209; 117/211; 117/213

(58) Field of Classification Search ................... 117/13, 117/24, 26, 209, 211, 213, 935
See application file for complete search history.

(56) References Cited

U.S. PATENT DOCUMENTS

| | | | |
|---|---|---|---|
| 3,031,403 A | 4/1962 | Bennett, Jr. | |
| 3,058,915 A | 10/1962 | Bennett | |
| 3,096,158 A | 7/1963 | Gaulé et al. | |
| 3,298,795 A | 1/1967 | Hamilton et al. | |
| 3,795,488 A | 3/1974 | Oliver | |
| 3,980,438 A | 9/1976 | Castonguay et al. | |
| 4,036,595 A | 7/1977 | Lorenzini et al. | |
| 4,211,600 A | 7/1980 | Cole | |
| 4,221,754 A | 9/1980 | Nowak | |
| 4,427,638 A | 1/1984 | Ellis et al. | |
| 4,443,663 A | 4/1984 | Ellis et al. | |
| 4,469,552 A | 9/1984 | Thornhill | |
| 4,510,015 A | 4/1985 | Ellis et al. | |

(Continued)

FOREIGN PATENT DOCUMENTS

DE    37 36 341 A1    5/1989

(Continued)

OTHER PUBLICATIONS

Holyer et al.; "Fast Si Sheet Growth by the Horizontal Supported Web Technique," Journal of Crystal Growth, vol. 79, pp. 572-577 (1986).

(Continued)

*Primary Examiner*—Robert M Kunemund
(74) *Attorney, Agent, or Firm*—Bromberg & Sunstein LLP (57) ABSTRACT

Methods and apparatus for concurrent growth of multiple crystalline ribbons from a single crucible employ meniscus shapers to facilitate continuous growth of discrete and substantially flat crystalline ribbons having controlled width.

22 Claims, 7 Drawing Sheets

U.S. PATENT DOCUMENTS

| | | | |
|---|---|---|---|
| 4,512,954 A | 4/1985 | Matsui | |
| 4,520,752 A | 6/1985 | Belouet | |
| 4,554,203 A | 11/1985 | Grabmaier et al. | |
| 4,577,588 A | 3/1986 | Mautref et al. | |
| 4,594,229 A | 6/1986 | Ciszek et al. | |
| 4,627,887 A | 12/1986 | Sachs | |
| 4,661,200 A | 4/1987 | Sachs | |
| 4,689,109 A | 8/1987 | Sachs | |
| 4,711,695 A | 12/1987 | Stormont et al. | |
| 4,721,688 A | 1/1988 | Stormont et al. | |
| 4,861,416 A | 8/1989 | Morrison | |
| 4,936,947 A | 6/1990 | Mackintosh | |
| 5,098,229 A | 3/1992 | Meier et al. | |
| 5,242,667 A | 9/1993 | Koziol et al. | |
| 5,370,078 A | 12/1994 | Kou et al. | |
| 5,690,732 A | 11/1997 | Otani et al. | |
| 5,723,337 A | 3/1998 | Muller et al. | |
| 5,911,826 A | 6/1999 | Hiraishi et al. | |
| 6,090,199 A | 7/2000 | Wallace, Jr. et al. | |
| 6,200,383 B1 | 3/2001 | Wallace, Jr. et al. | |
| 6,217,649 B1 | 4/2001 | Wallace, Jr. et al. | |
| 6,814,802 B2 * | 11/2004 | Wallace, Jr. | 117/23 |
| 7,022,180 B2 * | 4/2006 | Wallace, Jr. | 117/13 |

FOREIGN PATENT DOCUMENTS

| | | |
|---|---|---|
| EP | 0 390 502 | 10/1990 |
| EP | 0 170 856 | 9/1991 |
| EP | 0 875 606 | 11/1998 |
| GB | 2 135 595 A | 9/1984 |
| JP | 53073481 | 6/1978 |
| JP | 58194798 | 11/1983 |
| JP | 59182293 | 10/1984 |
| WO | 01/04388 A2 | 1/2001 |

OTHER PUBLICATIONS

Morrison (Feb. 1986), "Filament Guides for Silicon Ribbon Growth," NASA Tech. Briefs, USA, vol. 9, No. 2, 5 pgs.

Zoutendyk et al.(Mar. 1984), "Gas-Jet Meniscus Control in Ribbon Growth", NASA Tech. Briefs, USA, vol. 7, No. 3, 29 pgs.

PCT/US00/17651, International Search Report, Feb. 22, 2001, 3 pgs.

PCT/US03/34221, International Search Report, Apr. 14, 2004, 4 pgs.

* cited by examiner

METHOD AND APPARATUS FOR GROWING MULTIPLE CRYSTALLINE RIBBONS FROM A SINGLE CRUCIBLE

CROSS-REFERENCE TO RELATED APPLICATION

This application is a continuation of U.S. patent application Ser. No. 10/942,475 filed on Sep. 16, 2004 now U.S. Pat. No. 7,022,180, which is a continuation of U.S. patent application Ser. No. 10/284,067 filed on Oct. 30, 2002, now U.S. Pat. No. 6,814,802, both of which are owned by the assignee of the instant application and the disclosure of which are herein incorporated by reference in their entireties.

TECHNICAL FIELD

The invention generally relates to crystal growth. More particularly, the invention relates to methods and apparatus for growing crystalline ribbons of semiconductors materials.

BACKGROUND OF THE INVENTION

Figure 1A:
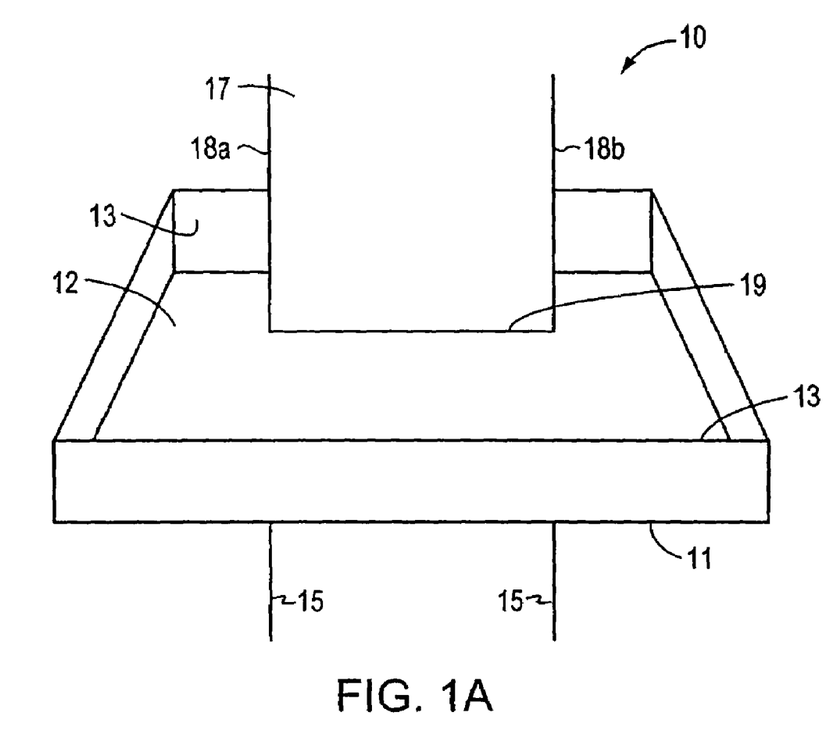
FIG. 1A is a schematic illustration of an embodiment of a single-ribbon growth system.

Silicon sheet material or ribbon is particularly important in making low cost solar cells. Continuous growth of silicon ribbon obviates the need for slicing of bulk produced silicon to form wafers. In U.S. Pat. Nos. 4,594,229; 4,627,887; 4,661,200; 4,689,109; 6,090,199; 6,200,383; and 6,217,649, continuous silicon ribbon growth is carried out by introducing two strings of high temperature material up through a crucible that includes a shallow layer of molten silicon. The strings serve to stabilize the edges of the growing ribbon. The molten silicon freezes into a solid ribbon just above the molten layer. U.S. Pat. Nos. 6,090,199 and 6,217,649 describe a method and apparatus for continuous replenishment of the feedstock material in a continuous silicon ribbon. As presently practiced, a single ribbon is grown out of a single crucible, with each ribbon machine having one such crucible. FIG. 1 illustrates this process.

In order to produce lower cost solar cells and hence expand large-scale electrical applications of solar electricity, it is important to have lower cost substrate materials for making the solar cell. The current invention provides new and improved methods and apparatus for growing silicon ribbons.

SUMMARY OF THE INVENTION

Methods and apparatus for concurrent growth of multiple ribbons from a single crucible have been developed. These techniques allow for efficient and low cost growth of silicon solar cell manufacturing.

In one aspect, the invention features a method for continuously growing multiple semiconductor ribbons concurrently in a single crucible. A crucible is provided that has multiple meniscus shapers that are disposed in a spaced relationship. A melt is formed in the crucible from a semiconductor material. The multiple meniscus shapers separate the melt into a plurality of distinct melt subregions. Multiple pairs of strings are arranged relative to the multiple meniscus shapers. Each pair of strings (i) has a fixed distance therebetween, (ii) emerges from one of the distinct melt subregions, and (iii) defines a pair of edges of a meniscus and controls the width of a ribbon. The multiple pairs of strings are continuously pulled away from a surface of the melt to form multiple discrete and substantially flat semiconductor ribbons.

In another aspect, the invention features a method for minimizing interference due to meniscus interactions between adjacent ribbons in a multiple semiconductor ribbon growth system. A melt is formed from a semiconductor material disposed in an open crucible. The melt is partitioned into a plurality of distinct melt subregions by disposing a plurality of meniscus shapers in the crucible. Each melt subregion has a distinct melt surface defined by a meniscus shaper. Multiple semiconductor ribbons are continuously grown from the crucible. Each of the ribbons is grown from a melt subregion by pulling a pair of spaced strings away from a distinct melt surface.

In yet another aspect, the invention features an apparatus for continuously growing multiple semiconductor ribbons concurrently in a single crucible. The apparatus includes a crucible for holding a melt of a semiconductor material; multiple meniscus shapers arranged in a spaced relationship in the crucible to partition the melt into a plurality of distinct melt subregions; multiple pairs of strings; and multiple afterheaters. Each pair of strings is disposed relative to one of the multiple meniscus shapers. Each pair of strings (i) has a fixed distance therebetween, (ii) emerges from one of the melt subregions, (iii) defines a pair of edges of a meniscus, and (iv) defines a width of one of the multiple semiconductor string ribbons as the pair of strings is pulled from the melt subregion. Each afterheater is disposed adjacent a surface of at least one of the semiconductor string ribbons to control the thermal profiles of the semiconductor string ribbons.

DESCRIPTION

The invention features techniques for the continuous and concurrent growth of multiple semiconductor ribbons from a single crucible, i.e., from one crystal growth machine. The method and apparatus described herein allow for a substantially increased production rate and efficiency and a substantial decrease in capital, material, and labor costs associated with the ribbon growth process by a factor that is virtually equal to the number of ribbons produced per machine. For example, using a double ribbon growth system in which two ribbons are concurrently grown in the same crucible reduces by half the costs associated with the process (except for the feedstock silicon and string). In addition, the output measured in terms of amount of ribbon area per unit time, i.e., the so-called areal output, can be substantially increased, allowing large scale production in a short time without requiring additional equipment.

In one aspect, the invention generally relates to a method for continuously growing multiple semiconductor ribbons concurrently in a single crucible. Two principal factors connected with growing multiple string ribbons from a single crucible are (1) the uniformity of thermal gradient from ribbon to ribbon and possible asymmetries associated with multiple ribbon growth and (2) meniscus interactions between the adjacent ribbons. The methods and apparatus of the invention take into consideration each of these factors to allow concurrent growth of multiple ribbons that are discrete and substantially flat in a single crucible. In the growth of a silicon ribbon, the silicon is subjected to vertical thermal gradients on the order of several hundred ° C./cm as it cools from its melting temperature of about 1412° C. The lack of ductility in silicon and the non-zero second derivative of the cooling curve can result in large stresses in the ribbon and make it difficult to grow a flat and wide ribbon.

Some of the stress is relieved by the formations of dislocations in the crystal structure and/or by buckling growth out of the ribbon plane. Buckling of ribbon results in non-flat ribbons, which are undesirable for solar cell applications. To facilitate flat ribbon growth, the cooling profile (measured along the growth axis) can be tailored to minimize the stress, such as by using an afterheater (sometimes called a radiation shield). U.S. Pat. No. 4,627,887, FIG. 13A, shows an example of radiation shields. The afterheater design can also influence the residual stress in the grown ribbon. Lower stress ribbons can typically be processed with higher yields.

A conventional string ribbon growth method is shown in FIG. 1A. A continuous ribbon growth system 10 includes a crucible 11 having therein a melt 12 of silicon and a pair of strings 15 extending through the crucible 11. A crystalline ribbon of silicon 17 is slowly drawn from the melt 12 as the cooler liquid silicon crystallizes at the top of the meniscus 19. The strings 15 passing through holes (not shown) in the bottom of the crucible 11 become incorporated in and define the edge boundaries 18a and 18b of the crystalline ribbon 17. The strings 15 stabilize the edges 18a and 18b as the ribbon 17 grows. The surface tension of the silicon prevents leaks through the holes of the crucible 11 where the strings 15 pass through. In the continuous growth system 10, the crucible 11 and the melt 12 may be housed within an inert gas-filled housing (not shown) to prevent oxidation of the molten silicon.

Figure 1B:
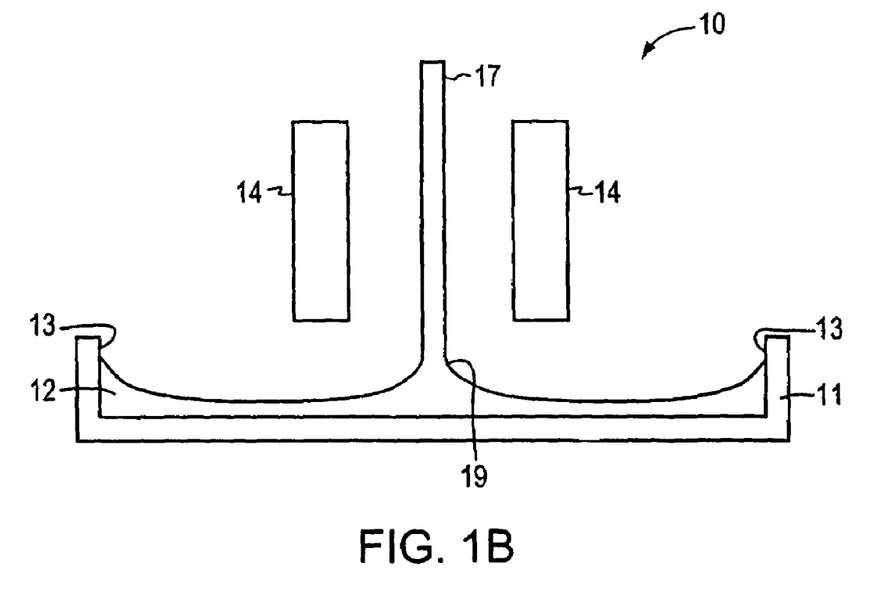
FIG. 1B is a schematic illustration of an embodiment of a single-ribbon growth system.

FIG. 1B shows a schematic cross-sectional view of the string ribbon growth system shown in FIG. 1A. The shape of the meniscus 19 and the vertical position of its attachment to the ribbon (at the solid-liquid interface, i.e., the interface of the melt 12 and the ribbon 17) is determined primarily by physical constants (Laplace's equation), the nominal depth of melt in the crucible, and weakly by the sides 13 of the crucible 11. The degree of coupling of the ribbon's meniscus 19 and the crucible wall is related to the physical distance separating the ribbon from the crucible sides 13. Afterheaters or radiation shields 14 are symmetrically deployed on either side of a growing ribbon 17 to modify the vertical thermal profile and to promote the growth of low-stress ribbons. For a single ribbon growth such as that illustrated in FIG. 1A, the afterheater may be disposed on either side of a growing ribbon in a symmetrical arrangement as illustrated in FIG. 1B.

For multiple ribbon growth from a single crucible, there is a geometric asymmetry that leads to a thermal asymmetry in the radiative flux, as discussed below.

Figure 2A:
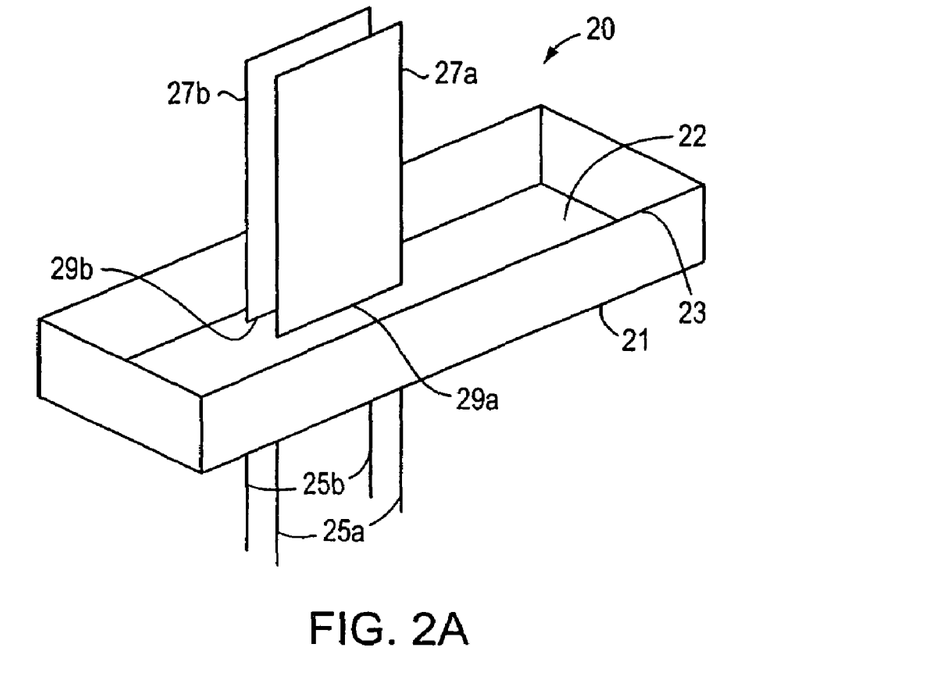
FIG. 2A is a schematic illustration of an embodiment of a two-ribbon growth system.

FIG. 2A shows a continuous two-ribbon dual growth system 20. The system 20 includes a crucible 21 having therein a melt 22 of silicon and two pairs of strings 25a and 25b extending through the crucible 21. Each of the two pairs of strings 25a and 25b has a fixed distance therebetween and emerge from the melt 22. Two crystalline ribbons 27a and 27b of silicon are drawn from the melt 22 as the cooler liquid silicon crystallizes at the tops of the menisci 29a and 29b, respectively. The two pairs of strings 25a and 25b passing through holes (four holes, again not shown, to accommodate two pairs of strings) in the bottom of the crucible 21 become incorporated in and define the edge boundaries of the crystalline ribbons 27a and 27b. The two pairs of strings 25a and 25b stabilize the edges of the ribbons 27a and 27b, respectively. The surface tension of the silicon prevents leaks through the holes of the crucible 21 where the strings 25a and 25b pass through.

Figure 2B:
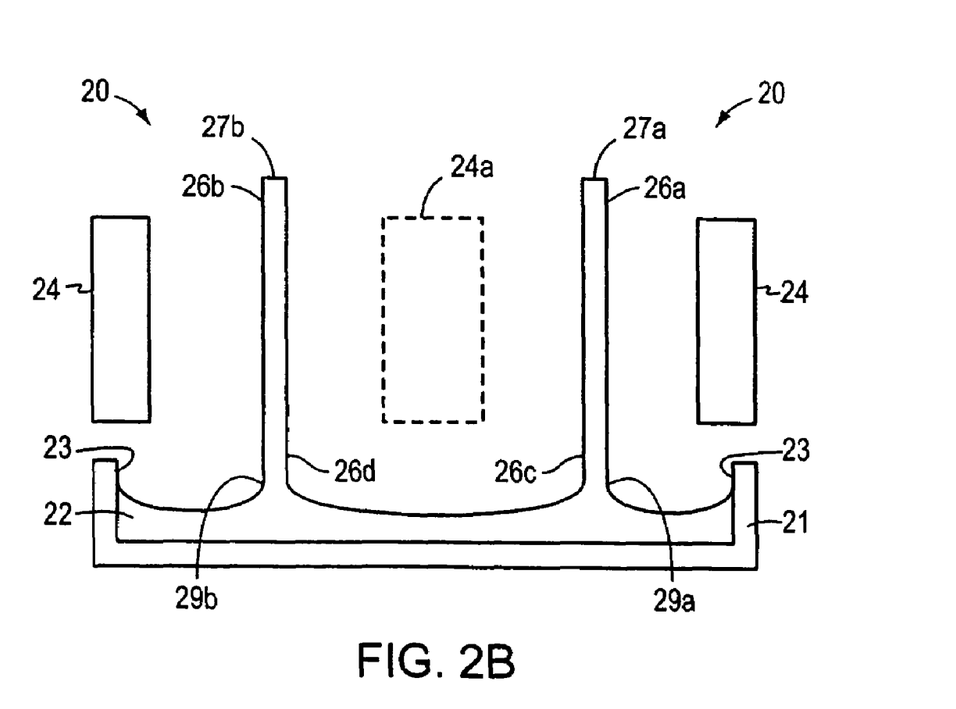
FIG. 2B is a schematic illustration of an embodiment of a two-ribbon growth system including afterheaters.

The cross-sectional view of the system shown in FIG. 2A is provided in FIG. 2B with the addition of afterheaters. The overall width of the crucible 21 shown in FIGS. 2A and 2B is taken to be the same as the width of the crucible 11 shown in FIGS. 1A and 1B. The shape of menisci 29a and 29b and their vertical position at the point of attachment (at the solid-liquid interfaces, i.e., the interface of the melt 22 and the ribbons 27a and 27b, respectively) are determined by the lateral disposition of the growing ribbons and the sides 23 of the crucible 21, as well as by the nominal depth of melt in the crucible. There is greater interaction between the menisci 29b and 29a with the sides 23 of the crucible 21 than between the meniscus 19 and sides 13 of the crucible 11 (shown in FIG. 1A), as the spacing between the ribbons and the crucible sides is considerably less in the two-ribbon system depicted in FIGS. 2A and 2B. Afterheaters or radiation shields 24 are deployed adjacent the outer surfaces (26a and 26b) of the ribbons 27a and 27b. As can be seen, there is a potential geometric asymmetry due to the disposition of afterheaters 24. No afterheaters are deployed adjacent the inner surfaces (26c and 26d) of the ribbons 27a and 27b, as indicated by the dotted region 24a.

Figure 2C:
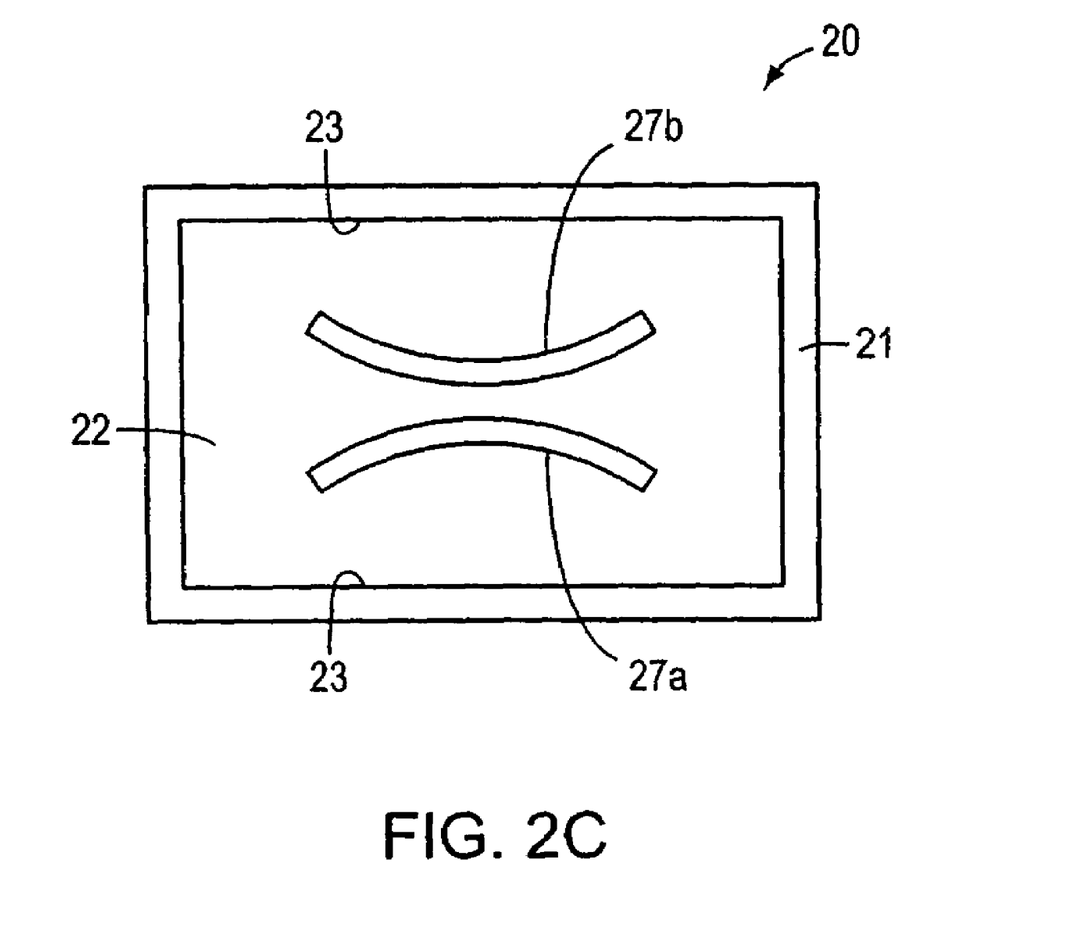
FIG. 2C is a schematic illustration of an embodiment of a two-ribbon growth system.

FIG. 2C shows a top view of the growth system depicted in FIG. 2A undergoing string ribbon growth. A highly curved meniscus results from the growth system of FIG. 2A both at the solid-liquid interface where growth occurs and at the sides of the crucible. A practical limit to the width of a crucible for single ribbon growth is such that this meniscus is curved along its entire surface. That is, the distance to the crucible edge is never great enough to allow for a flat or so-called free melt surface. For the single-ribbon crucible, the spacing between the ribbon and the crucible sides is great enough for the interaction to be weak. In order to realize economic benefits from multi-ribbon growth, it is desirable to reduce this spacing and to minimize the spacing between the ribbons. To reduce surface energy, the two menisci between two growing ribbons tend to reduce the surface area between them. In the limit, this capillary attraction causes the two ribbons to merge into each other, rendering multiple ribbon growth impossible. In addition to the simple capillary attraction described above, a growth instability exists that will cause adjacent growing ribbons to tend to merge if their respective menisci are allowed to interact. The edges of the ribbons still are fixed in position because of the strings present, but meniscus effects cause the two ribbons to be drawn together and eventually merge at their centers (as shown in FIG. 2C).

Figure 3A:
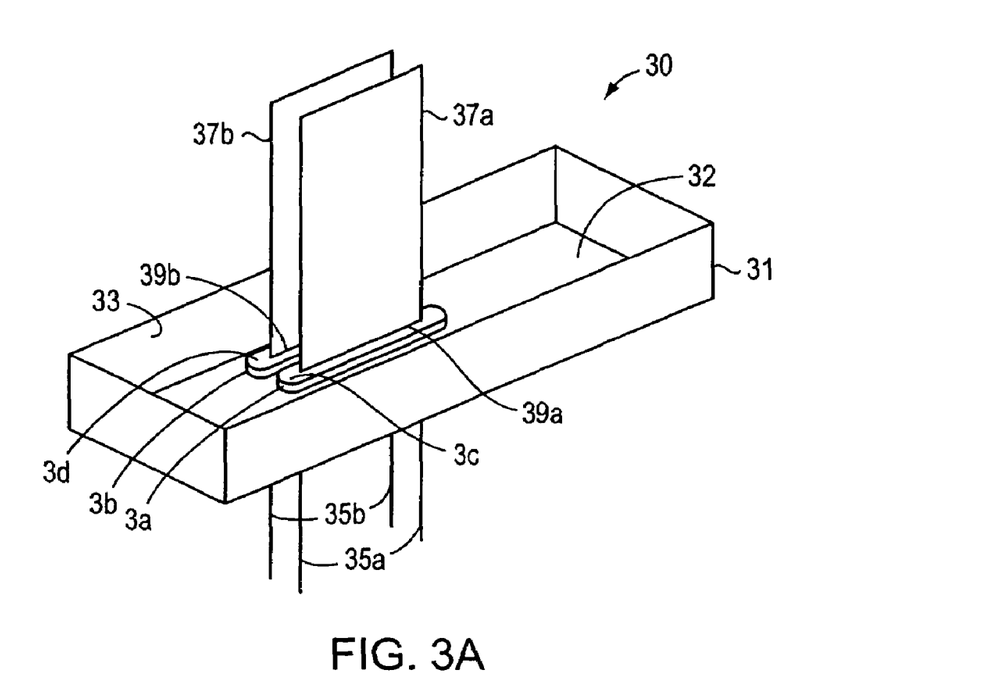
FIG. 3A is a schematic illustration of an embodiment of a two-ribbon growth system including two meniscus shapers.
Figure 3B:
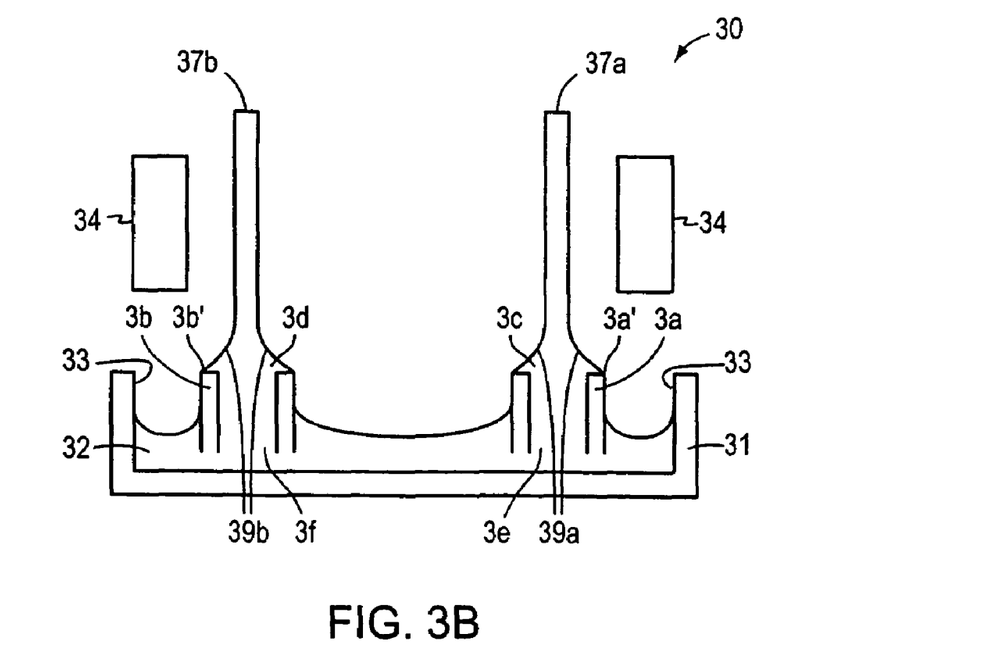
FIG. 3B is a schematic illustration of an embodiment of a two-ribbon growth system including two meniscus shapers and afterheaters.

An embodiment of the multi-ribbon growth system according to the invention is illustrated in FIGS. 3A and 3B. FIG. 3A shows a similar system as shown in FIG. 2A except that two meniscus controllers (i.e., meniscus shapers) 3a and 3b are placed around the two pair of strings 35a and 35b, respectively. The meniscus shapers 3a and 3b partition the melt 32 to form subregions 3c and 3d, respectively. The two pairs of strings 35a and 35b are continuously pulled away from the melt 32 for two ribbons 37a and 37b.

Figure 3C:
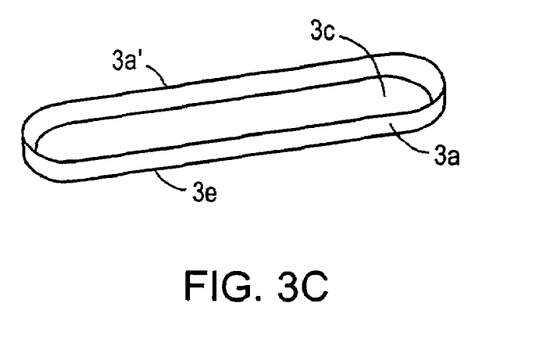
FIG. 3C is a schematic illustration of an embodiment of a meniscus shaper.

FIG. 3B is a cross-sectional view of a two-ribbon dual growth system 30 as shown in FIG. 3A. FIG. 3C depicts one of the meniscus shapers 3a in detail. The meniscus shapers 3a and 3b allow for contact with the bulk of the melt through openings 3e and 3f at the bottom of the meniscus shapers 3a and 3b. The meniscus shapers 3a and 3b partition the melt 32 to form subregions 3c and 3d, respectively, from which two ribbons 37a and 37b grow. The tops (3a' 30 and 3b') of the meniscus shapers 3a and 3b define the menisci 39a and 39b, respectively. For the growth of one ribbon (e.g., 37a), the meniscus 39a is able to act independently of the meniscus 39b of the nearby ribbon 37b. Thus, in such a configuration, the shape of menisci 39a and 39b and the vertical position of their attachment to the growing ribbon (at the solid liquid interface) are now determined by the tops (3a' and 3b') of their respective meniscus shapers 3a and 3b and not by the adjacent ribbon (37a or 37b) and a more distant crucible side 33. Therefore, the meniscus shapers have the effect of eliminating interaction between the adjacent growing ribbons.

The spacing between the shapers may be varied to fit a particular application. Without wishing to be bound by the theory below, the closest spacing for the meniscus shapers for multiple ribbon growth may be determined according to the following analysis. Based on the angle of attachment of the liquid silicon to the growing ribbon is constant at about 11°, and the density and surface tension of liquid silicon, as well as an estimate of the height of the interface above the free melt surface, it is possible to numerically integrate the governing equation (Laplace's equation, below) and step along the meniscus surface for the desired lateral distance. Successive iterations are performed until the required boundary conditions are met.

Figure 4:
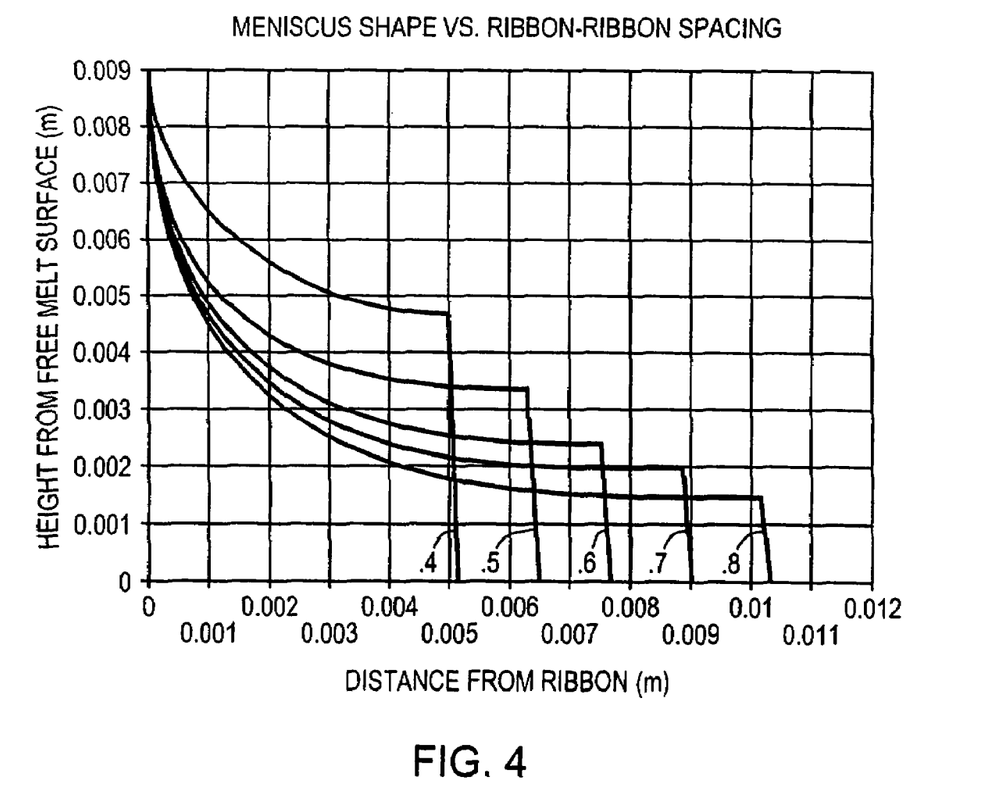
FIG. 4 is a schematic illustration of the effect of meniscus shape as a function of ribbon spacing in a multiple-ribbon growth system.

Laplace's equation: $p = Y(1/R_1 + 1/R_2)$ where: p is the pressure drop across the interface, Y is surface tension, and $R_1$ and $R_2$ are principal radii of curvature This technique yields a family of curves for meniscus shapes as a function of the dual ribbon spacing as illustrated in FIG. 4. These curves show one half of the meniscus cross section. The extreme left-hand edge is the surface of the growing ribbon to which the meniscus must attach and the horizontal axis is the distance from this ribbon surface. The vertical axis is the meniscus height above the free melt surface. Each curve represents a different proposed spacing between the ribbons. By recognizing that a meniscus shaper must intersect this meniscus in order for the two ribbons to be de-coupled from each other, FIG. 4 can be used as a design tool.

In one exemplary embodiment, 8 mm wide meniscus shapers or 4 mm on the half-width scale as shown in FIG. 4 are placed with a 0.5 inch ribbon spacing, which requires a vertical position of at least 3.5 mm above the free melt surface. Given some variation in control of the melt depth in a crucible, this leads to a required height of about 5 mm above the free melt surface. Assuming a nominal depth of melt of 4 mm, this then gives a meniscus shaper height of 9 mm above the floor of the crucible. To make multiple ribbon growth viable, it is important to control the melt depth. U.S. Pat. No. 6,200,383 describes a method for melt-depth control.

Figure 5:
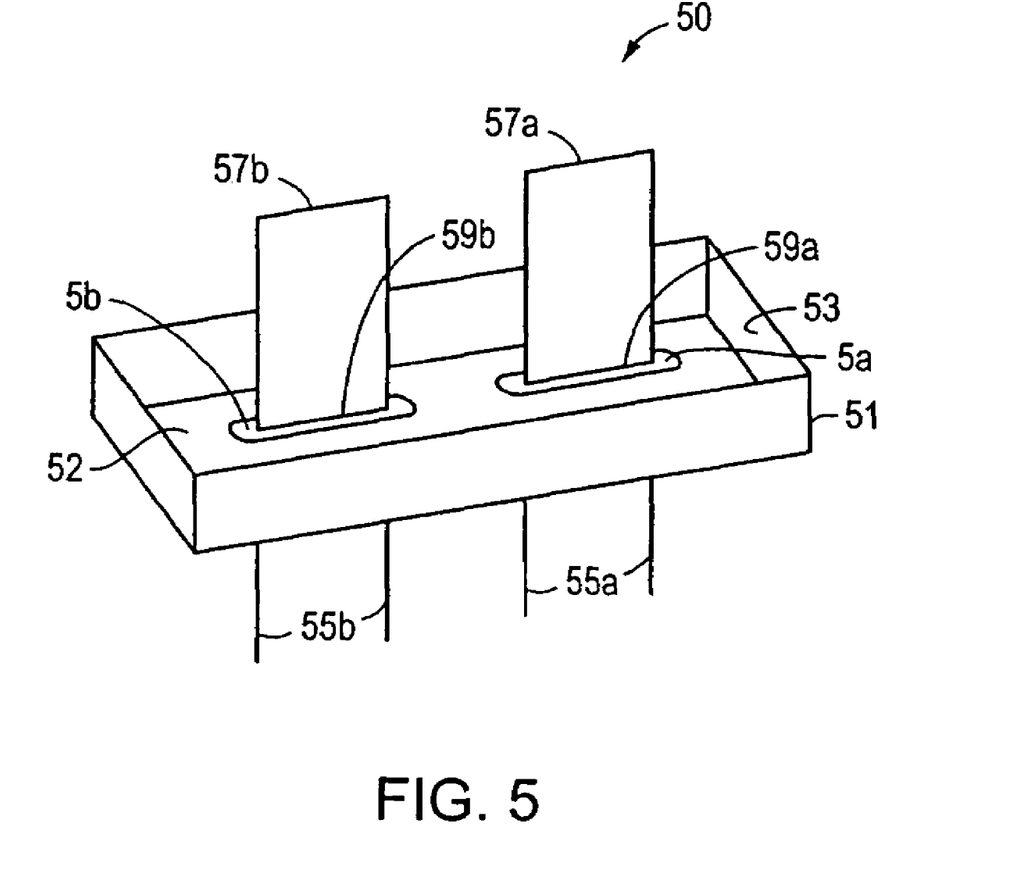
FIG. 5 is a schematic illustration of a two-ribbon growth system having a head-to-tail configuration.

The configurations of the pairs of strings may be such that the ribbons are grown, for example, in a face-to-face pattern as illustrated in FIGS. 3A-3B, or in a head-to-tail pattern as illustrated in FIG. 5. The configuration may also be a mix of head-to-tail and face-to-face, e.g., a matrix, or other configurations, e.g., a radial configuration, in which ribbons would be disposed to resemble the spokes of a wheel.

The multiple miniscus shapers may be identical in shape and size or different in shape and/or size. The multiple pairs of strings may also have different distances between the strings within a pair, thereby allowing concurrent growth of ribbons of different sizes. The ribbons are typically grown, i.e., pulled, in a direction perpendicular to or substantially perpendicular to the melt surface from where the ribbon is grown. Other growth directions, e.g., angled pulling of strings, may be employed in certain growth systems to achieve the desired ribbon specifications.

Figure 6:
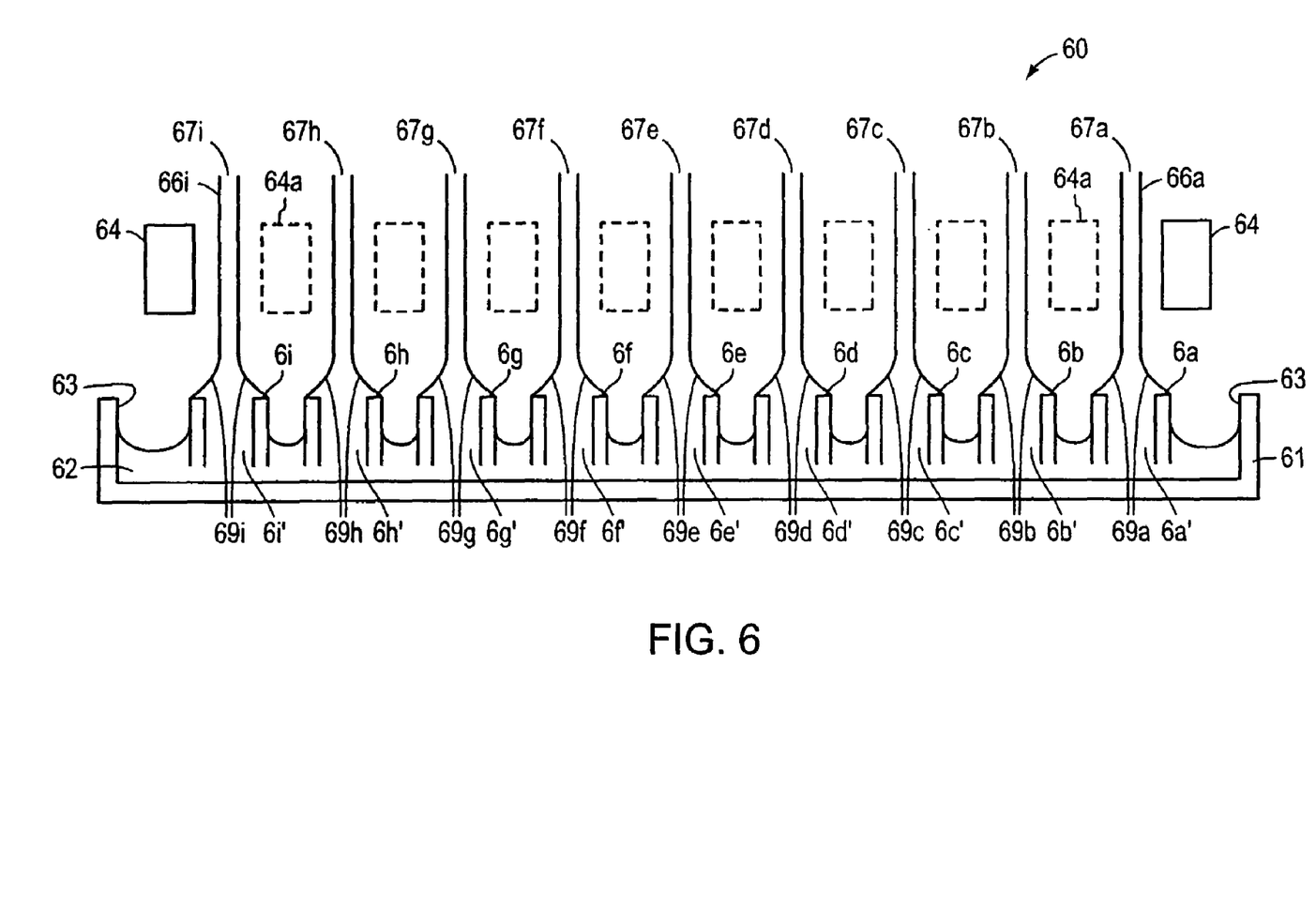
FIG. 6 is a schematic illustration of an embodiment of a nine-ribbon growth system.

The number of ribbons that can be grown from a single crucible may be varied according to the applications. In one embodiment, as shown in FIG. 6, nine ribbons are concurrently grown from a single crucible 61. Nine meniscus shapers (6a-6i) are placed in the crucible 61 to form mine melt subregions (6a'-6i'). Each of the nine subregions supports the growth of a string ribbon. Afterheaters 64 are placed adjacent the outside surfaces (66a and 66i) of the two outermost ribbons (67a and 67i). The inner ribbons (67b-67h) have nothing between them as indicated by the dotted regions 64a. For the inner ribbons (67b-67h) in a face-to-face configuration such as that depicted in FIG. 6, the surrounding thermal environment is due primarily to the adjacent growing ribbons and therefore is very uniform and constant because each ribbon now is surrounded by constant emissivity surfaces. In such a case, the adjacent ribbons act as afterheaters for each other.

In another aspect, the invention features a method for minimizing interference between adjacent ribbons in a multiple semiconductor ribbon growth system. In one exemplary embodiment and referring again to FIGS. 3A-3B, meniscus shapers 3a and 3b are used to minimize the interference between adjacent growing ribbons 37a and 37b in a two-ribbon dual growth system. Instead of the adjacent ribbons and sides 33 of the crucible 31 determining the menisci 39a and 39b, the meniscus shapers 3a and 3b provide the edge boundaries for isolated melt subregions 3c and 3d (each with a distinct melt surface defined by the meniscus shapers), from which two pairs of strings are continuously pulled away from the melt and two ribbons are grown.

Similarly in FIG. 6, meniscus shapers 6a-6i are used to minimize the interference between adjacent growing ribbons 67a-67i in a nine-ribbon dual growth system. Instead of the adjacent ribbons and sides 63 of the crucible 61 determining the menisci 69a-69i, the meniscus shapers 6a-6i provide the boundaries for nine isolated melt subregions (6a'-6i', each with a distinct melt surface defined by the meniscus shapers), from which the nine pairs of strings (not shown) are continuously pulled and nine ribbons 67a-67i are grown.

It has now been discovered that ribbon growth is not affected by a geometrical asymmetry in the radiative thermal environment as produced, for example, by having an afterheater only on one side of the ribbon. The thermal resistance of the ribbon through its thickness is so low that symmetry of the radiative environment is not required. Thus, the radiative flux on either side of a growing ribbon can be asymmetric and still allow for successful growth of flat ribbons. This observation is of particular significance for a two-ribbon system as each ribbon "sees" an identical radiative environment.

An important aspect of the invention is that growth of many ribbons from a single crucible results in a thermal environment for all the inner ribbons, excluding the two outer ribbons, that is extremely uniform in time. The uniformity in time can be particularly valuable, as it is well known to one skilled in the art that deposits of silicon oxide or silicon carbyoxide can build up over time on the afterheaters and thereby affect their radiative properties. This in turn can result in changes in the thermal profile that can make it more difficult to achieve the growth of flat, low stress ribbon.

The invention also features an apparatus for continuously growing multiple semiconductor ribbons concurrently in a single crucible. Exemplary embodiments of the apparatus are depicted in FIGS. 3A, 3B and 6.

Referring again to FIG. 3A, one embodiment of a two-ribbon growth system 30 includes a crucible 31 for holding a melt 32, meniscus shapers 3a and 3b for partitioning of the melt surface, string pairs 35a and 35b placed in the crucible and emerging from the meniscus shapers 3a and 3b, respectively, and afterheaters 34 (not shown in FIG. 3A but shown in FIG. 3B) placed adjacent the outer surfaces (26a and 26b) of the ribbons 37a and 37b.

Referring again to FIG. 6, one embodiment of a nine-ribbon growth system 60 includes a crucible 61 for holding a melt 62, meniscus shapers 6a-6i for partitioning of the melt surface, nine pairs of strings (not shown) placed in the crucible and emerging from the meniscus shapers 6a-6i, respectively, and afterheaters 64 placed adjacent the outer surfaces (66a and 66i) of the ribbons 67a and 67i.

A housing is typically included to isolate from the ambient environment the melt and a portion of the solidifying ribbon, especially the solid-liquid interface and any part of the ribbon having a temperature of 400° C. or higher. The housing is typically filled with an inert gas, e.g., Argon.

Sheet materials or ribbons of materials that may be grown using the methods and apparatus discussed herein include, e.g., silicon, germanium, silicon carbide, gallium arsenide, gallium phosphide, indium arsenide, gallium antimonide, indium antimonide, indium phosphide, gallium arsenide antimonide, gallium nitride, ternary compounds, and alloys thereof. The methods and apparatus discussed above can be applied in multi-ribbon growth systems where two, three, four or more (e.g., twenty) ribbons are concurrently grown from a single crucible.

Each of the patent documents disclosed hereinabove is incorporated in its entirety by reference herein. Variations, modifications, and other implementations of what is described herein will occur to those of ordinary skill in the art without departing from the spirit and the scope of the invention. Accordingly, the invention is not to be limited only to the preceding illustrative descriptions.

What is claimed is:

1. A method for forming multiple semiconductor ribbons in a crucible, comprising:
   disposing multiple meniscus shapers in the crucible;
   forming a melt from a semiconductor material in the crucible, the multiple meniscus shapers forming a plurality of melt subregions in the crucible; and
   pulling a semiconductor ribbon away from a surface of each melt subregion to form multiple semiconductor ribbons.

2. The method of claim 1 further comprising using at least one of the meniscus shapers to determine the vertical position of attachment between a surface of the melt in a particular melt subregion and a respective semiconductor ribbon growing therefrom.

3. The method of claim 1 further comprising using at least one of the multiple meniscus shapers to control the shape of a meniscus of a semiconductor ribbon.

4. The method of claim 1 wherein a first meniscus of a first semiconductor ribbon is independent of a first meniscus of a second semiconductor ribbon.

5. The method of claim 4 further comprising controlling the shape of at least one of the first meniscus and the second meniscus using the top of the respective meniscus shaper.

6. The method of claim 1 wherein a portion of at least one of the meniscus shapers extends below the surface of the melt.

7. The method of claim 1 further comprising minimizing interaction between adjacent semiconductor ribbons using the multiple meniscus shapers.

8. The method of claim 1 further comprising forming a uniform thermal profile to minimize stress on the multiple semiconductor ribbons.

9. The method of claim 1 further comprising forming the multiple semiconductor ribbons substantially concurrently.

10. The method of claim 1 further comprising forming the multiple semiconductor ribbons in a face-to-face pattern.

11. The method of claim 1 further comprising forming the multiple semiconductor ribbons in a head-to-tail pattern.

12. An apparatus for growing multiple semiconductor ribbons, comprising:
    a crucible for holding a melt of a semiconductor material; and
    multiple meniscus shapers disposed in the crucible to separate the melt into a plurality of melt subregions, each meniscus shaper determining in a respective melt subregion the vertical position of attachment between a surface of melt in the respective melt subregion and a semiconductor ribbon grown from the respective melt subregion.

13. The apparatus of claim 12 wherein a portion of the melt in each melt subregion is crystallized.

14. The apparatus of claim 13 wherein the semiconductor ribbon is pulled away from the melt surface from the portion of the melt crystallized.

15. The apparatus of claim 12 wherein at least one of the multiple meniscus shapers controls the shape of a respective meniscus of the respective semiconductor ribbon.

16. The apparatus of claim 12 wherein a first meniscus of a first semiconductor ribbon is independent of a second meniscus of a second semiconductor ribbon.

17. The apparatus of claim 12 wherein a portion of at least one of the meniscus shapers extends below the surface of the melt.

18. The apparatus of claim 12 further comprising a housing for isolating the melt from the ambient environment.

19. An apparatus for semiconductor ribbon growth comprising:
    a crucible for holding a melt of a semiconductor material; and
    a plurality of meniscus shapers disposed in the crucible to separate the melt into a plurality of melt subregions, a first melt subregion including a first melt surface defined by a first meniscus shaper and a second melt subregion including a second melt surface defined by a second meniscus shaper, the first meniscus shaper minimizing interference between a first semiconductor ribbon growing from the first melt surface and a second semiconductor ribbon growing from the second melt surface.

20. The apparatus of claim 19 wherein the first meniscus shaper determines the vertical position of attachment between the first melt surface and the first semiconductor ribbon.

21. The apparatus of claim 19 wherein a first meniscus of the first semiconductor ribbon is independent of a second meniscus of the second semiconductor ribbon.

22. The apparatus of claim 19 further comprising a housing for isolating the melt of the semiconductor material from the ambient environment.

* * * * *